United States Patent
Shao et al.

(10) Patent No.: US 12,446,207 B2
(45) Date of Patent: Oct. 14, 2025

(54) SEMICONDUCTOR DEVICE HAVING BOTTOM BIT LINE AND NARROW CHANNEL, AND FORMING METHOD THEREOF

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN); Youming Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 602 days.

(21) Appl. No.: 17/805,977

(22) Filed: Jun. 8, 2022

(65) Prior Publication Data
US 2023/0301064 A1 Sep. 21, 2023

Related U.S. Application Data

(63) Continuation of application No. PCT/CN2022/085761, filed on Apr. 8, 2022.

(51) Int. Cl.
*H10B 12/00* (2023.01)

(52) U.S. Cl.
CPC ......... *H10B 12/312* (2023.02); *H10B 12/482* (2023.02); *H10B 12/485* (2023.02); *H10B 12/488* (2023.02)

(58) Field of Classification Search
None
See application file for complete search history.

(56) References Cited

U.S. PATENT DOCUMENTS

| | | | |
|---|---|---|---|
| 5,817,552 A | 10/1998 | Roesner et al. |
| 7,670,909 B2 | 3/2010 | Cho |
| 8,293,604 B2 | 10/2012 | Yoon et al. |
| 2007/0190766 A1 | 8/2007 | Seo et al. |
| 2007/0246783 A1 | 10/2007 | Moon et al. |

FOREIGN PATENT DOCUMENTS

CN 101471304 A 7/2009

OTHER PUBLICATIONS

International Search Report cited in PCT/CN2022/085761 mailed Dec. 5, 2022, 9 pages.

*Primary Examiner* — Suberr L Chi
(74) *Attorney, Agent, or Firm* — Kilpatrick Townsend & Stockton LLP

(57) ABSTRACT

The present disclosure relates to the technical field of semiconductor manufacturing, and in particular to a semiconductor device and a forming method thereof. The forming method of a semiconductor device includes: providing a substrate; etching the substrate to form first recesses and second recesses located below the first recesses and communicating with the first recesses; forming a bit line in the second recesses; forming, at bottoms of the first recesses, an isolation layer covering the bit line; enlarging an inner diameter of the first recess above the isolation layer; and forming a gate layer on a sidewall of the first recess whose inner diameter is enlarged.

8 Claims, 13 Drawing Sheets a ⟷ a' b ⟷ b' c ⟷ c' d ⟷ d'

SEMICONDUCTOR DEVICE HAVING BOTTOM BIT LINE AND NARROW CHANNEL, AND FORMING METHOD THEREOF

CROSS-REFERENCE TO RELATED APPLICATIONS

The present application is a continuation application of International Patent Application No. PCT/CN2022/085761, filed on Apr. 8, 2022, which claims the priority to Chinese Patent Application No. 202210252481.X, titled "SEMICONDUCTOR DEVICE AND FORMING METHOD THEREOF" and filed with the China National Intellectual Property Administration (CNIPA) on Mar. 15, 2022. The entire contents of International Patent Application No. PCT/CN2022/085761 and Chinese Patent Application No. 202210252481.X are incorporated herein by reference.

TECHNICAL FIELD

The present disclosure relates to the technical field of semiconductor manufacturing, and in particular to a semiconductor device and a forming method thereof.

BACKGROUND

As a semiconductor device commonly used in an electronic device such as a computer, a dynamic random access memory (DRAM) includes a plurality of memory cells, and each memory cell usually includes a transistor and a capacitor. The transistor has a gate electrically connected to a word line, a source electrically connected to a bit line, and a drain electrically connected to the capacitor. A word line voltage on the word line can control on and off of the transistor, such that data information stored in the capacitor can be read through the bit line or data information can be written into the capacitor through the bit line.

However, in the DRAM and other semiconductor devices, as storage density increases continuously, a space retained for a gate layer, especially for a wrap-around gate structure, is gradually reduced. This not only leads to an increase in process difficulty, but also easily causes a short-circuit problem between adjacent gates, eventually resulting in performance degradation of the semiconductor device.

Therefore, how to increase a space for forming a gate structure, simplify a formation process of the semiconductor device, and improve performance of the semiconductor device is a technical problem to be resolved urgently at present.

SUMMARY

According to some embodiments, the present disclosure provides a forming method of a semiconductor device, including:
  providing a substrate;
  etching the substrate to form first recesses and second recesses located below the first recesses and communicating with the first recesses;
  forming a bit line in the second recesses;
  forming, at bottoms of the first recesses, an isolation layer covering the bit line;
  enlarging an inner diameter of the first recess above the isolation layer; and
  forming a gate layer on a sidewall of the first recess whose inner diameter is enlarged.

According to some other embodiments, the present disclosure further provides a semiconductor device, including:
  a substrate;
  bit lines, located in the substrate and extending along a first direction, where the first direction is a direction parallel to a top surface of the substrate;
  active pillars, located in the substrate and above each of the bit lines, where each of the active pillars includes a drain region in contact with the bit line and a channel region located above the drain region, and a width of the drain region is greater than a width of the channel region along the first direction;
  an isolation layer, located above the bit line and covering a sidewall of the drain region; and
  a gate layer, distributed around a periphery of the channel region in the active pillar.

DETAILED DESCRIPTION

Specific implementations of a semiconductor device and a forming method thereof provided in the present disclosure are described in detail below with reference to the accompanying drawings.

Figure 1:
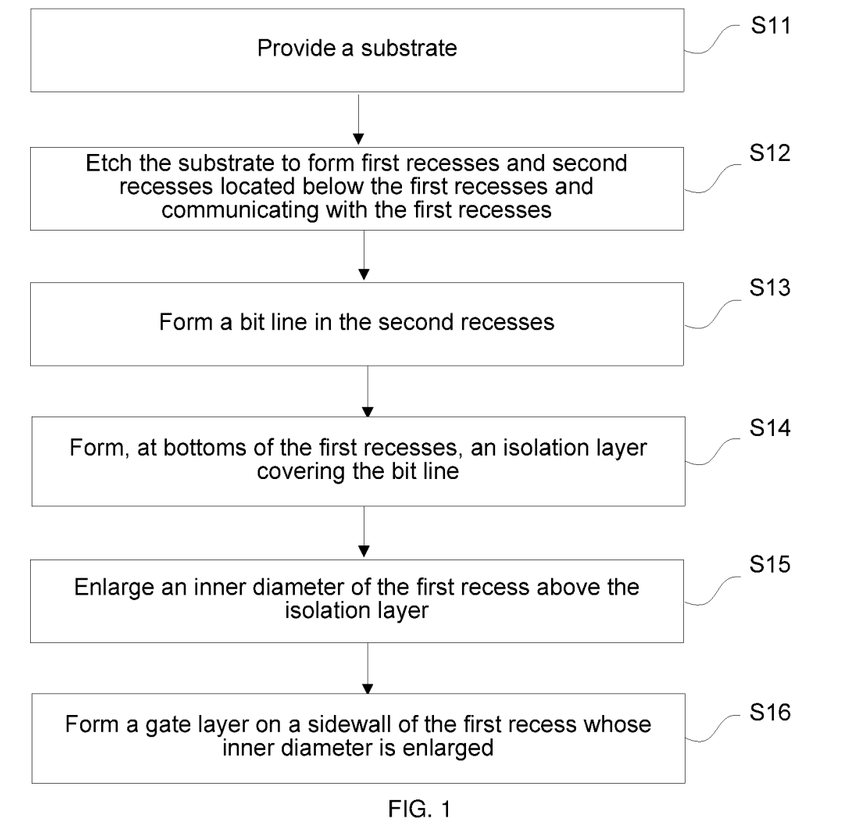
FIG. 1 is a flowchart of a forming method of a semiconductor device according to a specific implementation of the present disclosure.
Figure 2:
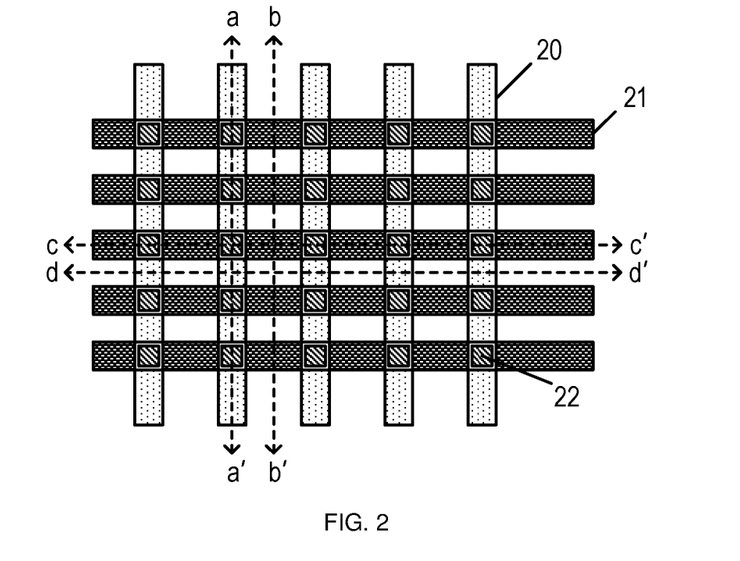
FIG. 2 is a top view of a partial structure of a formed semiconductor device according to a specific implementation of the present disclosure.
Figure 3A:
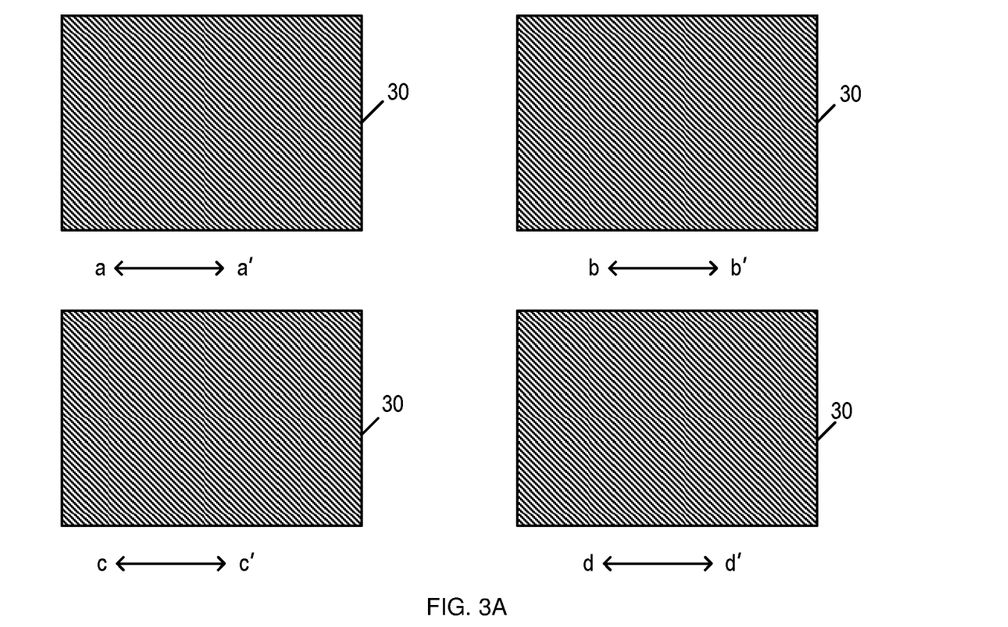
FIG. 3A to FIG. 3Q are each a schematic cross-sectional view of a main process during formation of a semiconductor device according to a specific implementation of the present disclosure.
Figure 3B:
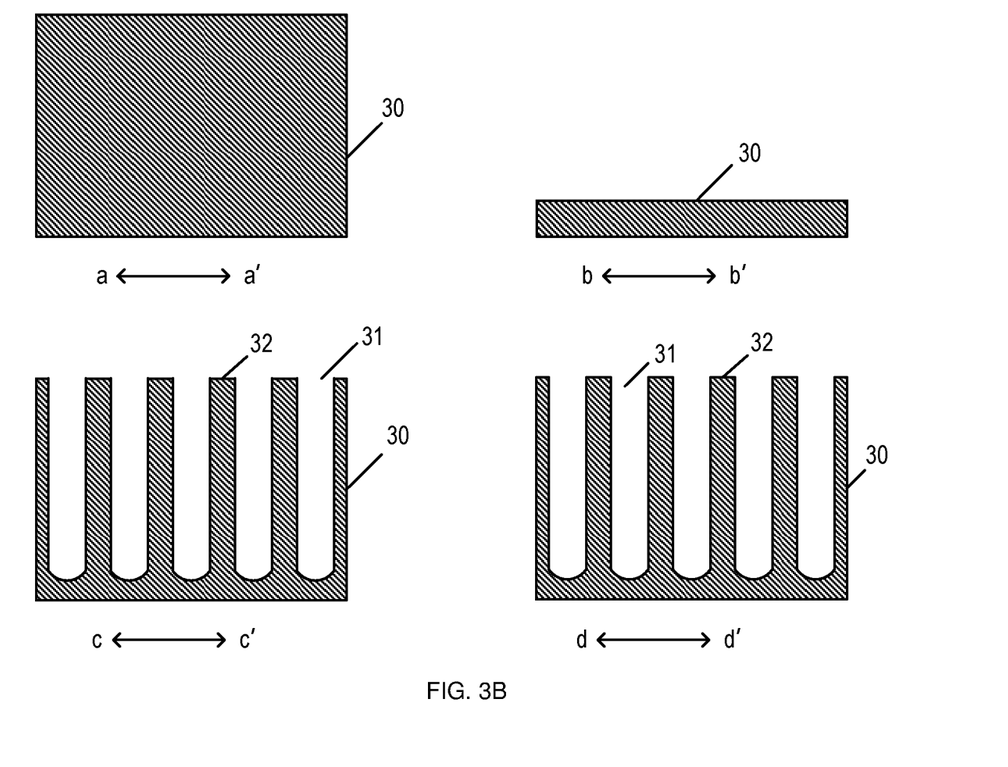
Figure 3C:
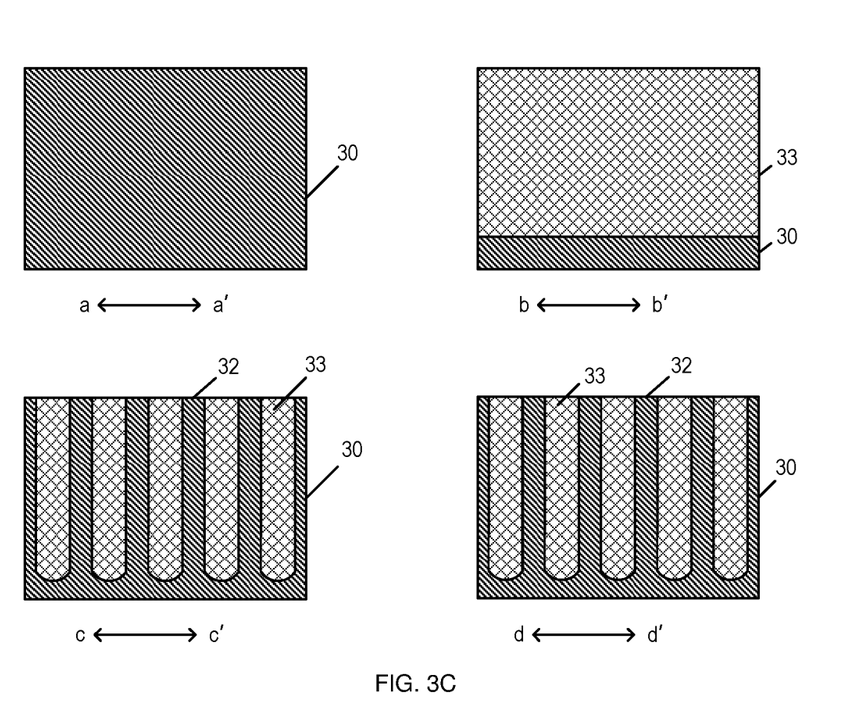

The specific implementations provide a forming method of a semiconductor device. FIG. 1 is a flowchart of a forming method of a semiconductor device according to a specific implementation of the present disclosure. FIG. 2 is a top view of a partial structure of a formed semiconductor device according to a specific implementation of the present disclosure. FIG. 3A to FIG. 3Q are each a schematic cross-sectional view of a main process during formation of a semiconductor device according to a specific implementation of the present disclosure. FIG. 3A to FIG. 3Q are schematic cross-sectional diagrams of the main process during the formation of the semiconductor device in four directions in FIG. 2: a first direction a-a', a second direction b-b', a third direction c-c', and a fourth direction d-d', to clearly show a formation process of the semiconductor device. In the specific implementations, the semiconductor device may be, but is not limited to, a DRAM. As shown in FIG. 1, FIG. 2, and FIG. 3A to FIG. 3Q, the forming method of the semiconductor structure includes the following steps:

Step S11. Provide a substrate 30, as shown in FIG. 3A.

Specifically, the substrate 30 may be, but is not limited to, a silicon substrate. This specific implementation is described by an example in which the substrate 30 is a silicon substrate. In other examples, the substrate 30 may be a semiconductor substrate such as a gallium nitride substrate, a gallium arsenide substrate, a gallium carbide substrate, a silicon carbide substrate, or a silicon-on-insulator (SOI) substrate.

Step S12. Etch the substrate 30 to form first recesses 35 and second recesses 37 located below the first recesses 35 and communicating with the first recesses 35, as shown in FIG. 3F.

Figure 3D:
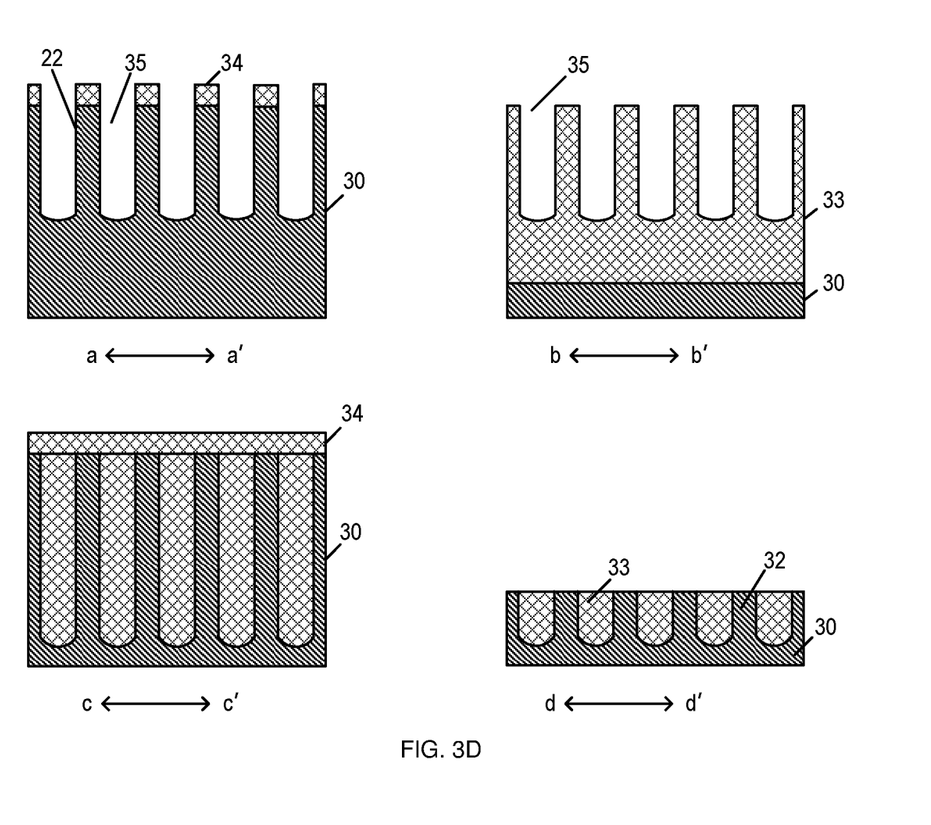
Figure 3E:
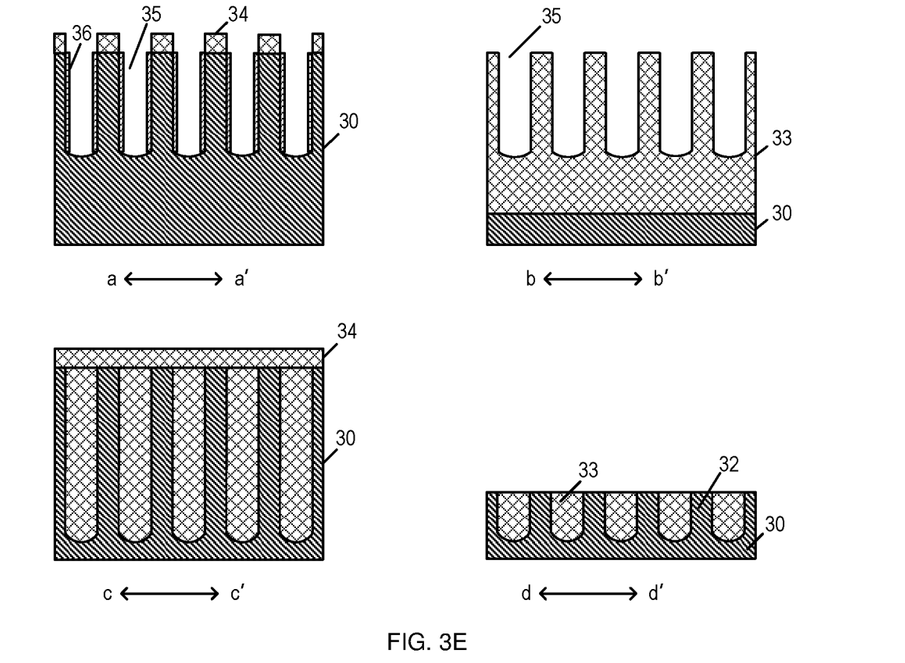
Figure 3F:
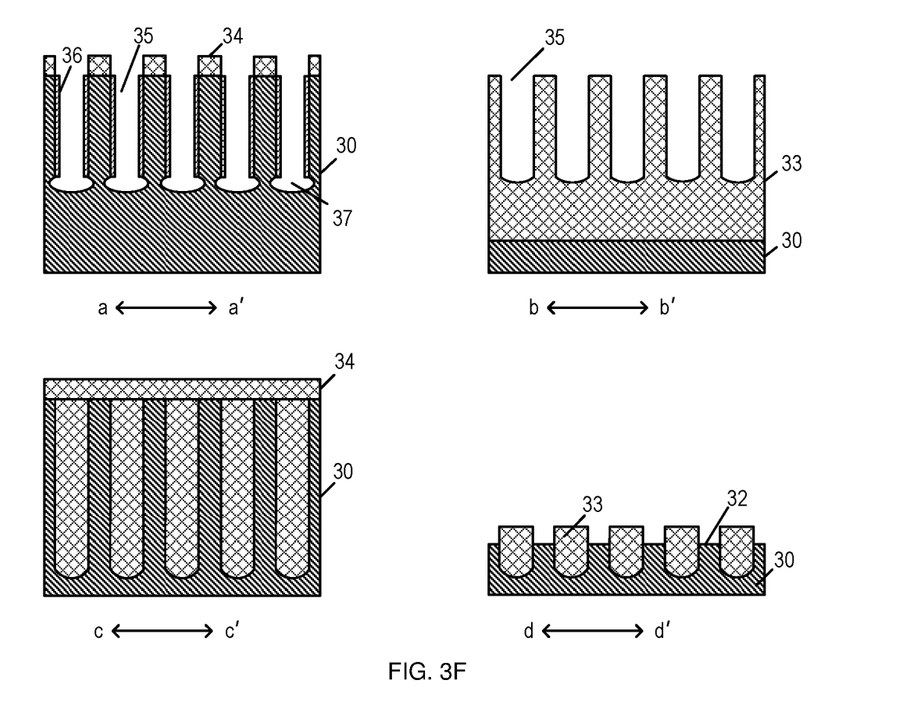

In some embodiments, a specific step of forming first recesses 35 and second recesses 37 located below the first recesses 35 and communicating with the first recesses 35 includes:

etching the substrate 30 to form a plurality of first recesses 35 arranged parallel to and spaced apart from each other along a first direction a-a' and an active pillar 22 located between adjacent ones of the first recesses 35, where the first recess 35 extends along a direction perpendicular to a top surface of the substrate 30, and the first direction a-a' is a direction parallel to the top surface of the substrate 30, as shown in FIG. 3D; and etching the substrate 30 along the first recesses 35, and forming, below the first recesses 35, the second recesses 37 communicating with the first recesses 35, where an inner diameter of the second recess 37 is greater than the inner diameter of the first recess 35 located above and communicating with the second recess 37, as shown in FIG. 3F.

In some embodiments, before the second recesses 37 communicating with the first recesses 35 are formed below the first recesses 35, the forming method further includes the following step:

forming a protective layer 36 covering the sidewall of the first recess 35.

Specifically, the substrate 30 may be etched along a direction perpendicular to the top surface of the substrate 30 by a dry etching process, to form a plurality of first etched recesses 31 arranged parallel to and spaced apart from each other along the third direction c-c'. The first etched recess 31 extends along the first direction a-a', and a remaining part of the substrate 30 between adjacent ones of the first etched recesses 31 forms a first initial active pillar 32, as shown in FIG. 3B. The method of etching the substrate 30 to form the first etched recess 31 may be performed by a self-aligned double patterning (SADP) process, or a self-aligned quadruple patterning (SAQP) process, to accurately control a position and shape of the first etched recess 31. Next, doped ions of a first type and doped ions of a second type are respectively implanted into different regions of the first initial active pillar 32, to form a second initial active pillar including a source region, a channel region located above the source region, and a drain region located above the channel region. A conductivity type of the doped ions of the first type is opposite to that of the doped ions of the second type. Subsequently, an insulating material such as an oxide material (for example, silicon dioxide) is deposited into the first etched recess 31, to form a second filling layer 33, as shown in FIG. 3C.

Subsequently, an oxide material (for example, silicon dioxide) is deposited on the top surface of the substrate 30 to form a first mask layer 34. The first mask layer 34 is patterned to form a plurality of first etch windows exposing the substrate 30. The substrate 30 is etched downward along the first etch window by the dry etching process, to form the first recesses 35 arranged spaced apart from each other along the first direction a-a'. A remaining part of the second initial active pillar located between adjacent ones of the first recesses 35 forms an active pillar 22, as shown in FIG. 3D. Next, a protective layer 36 is deposited to the first recess 35 along the first etch window, a part of the protective layer 36 at the bottom of the first recess 35 is removed by an etch back process, and only a part of the protective layer 36 on a sidewall of the first recess 35 is retained, as shown in FIG. 3E. The protective layer 36 covers only the sidewall of the first recess 35, such that the bottom of the first recess 35 can be etched without causing damage to the active pillar 22. Then, the bottom of the first recess 35 is further etched along the first etch window, and the second recesses 37 communicating with the first recesses 35 are formed below the first recesses 35. An inner diameter of the second recess 37 is greater than the inner diameter of the first recess 35 located above and communicating with the second recess 37, as shown in FIG. 3F. The inner diameter of the second recess 37 is set to be greater than the inner diameter of the first recess 35, such that a width of a remaining part of the substrate 30 between adjacent ones of the second recesses 37 along the first direction a-a' is less than a width of the active pillar 22 between adjacent ones of the first recesses 35, thereby help subsequently connect a plurality of the second recesses 37 arranged spaced apart from each other along the first direction a-a', to form a bit line 20 extending along the first direction a-a', as shown in FIG. 2.

The process of etching the bottom of the first recess 35 to form the second recess 37 may be a Bosch process, to simplify the etching process of the second recess 37 and ensure that the inner diameter of the second recess 37 along the first direction a-a' is greater than the inner diameter of the first recess 35 along the first direction a-a'. Those skilled in the art may alternatively use other methods to form the second recess 37 according to actual needs.

Before the second recess 37 is formed, the sidewall of the first recess 35 is covered by the protective layer 36 for protection. Therefore, various methods may be used to form the second recess 37, thereby improving flexibility in process selection. Correspondingly, a cross section of the second recess 37 may be of various shapes. In some embodiments, the cross section of the second recess 37 is elliptical, sector-shaped, or polygonal.

Step S13. Form a bit line 20 in the second recesses 37, as shown in FIG. 2 and FIG. 3H.

In some embodiments, a specific step of forming a bit line 20 in the second recesses 37 includes:

forming the bit line communicating with the second recesses arranged along the first direction and filling the second recesses.

Figure 3G:
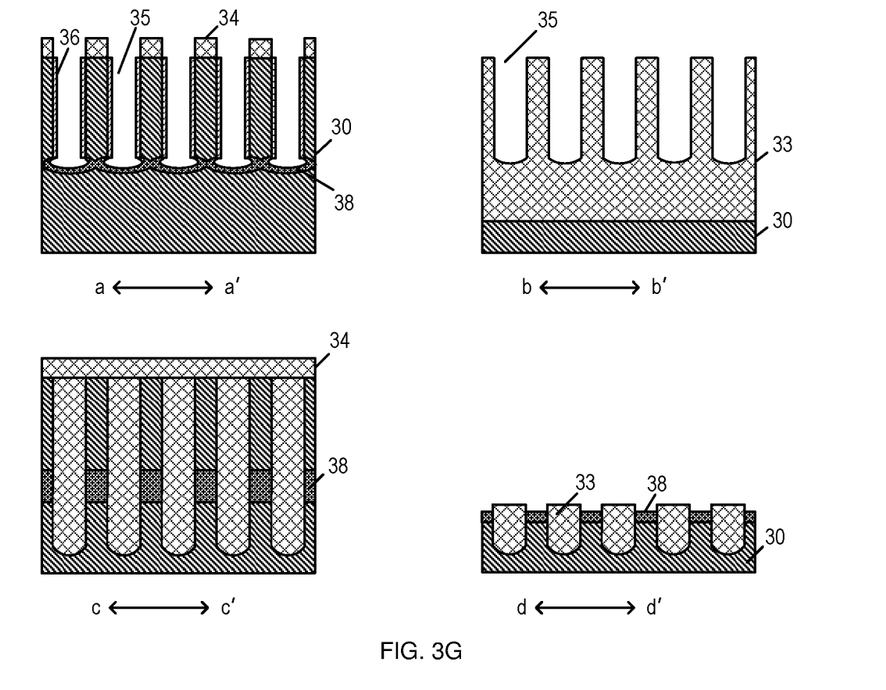
Figure 3H:
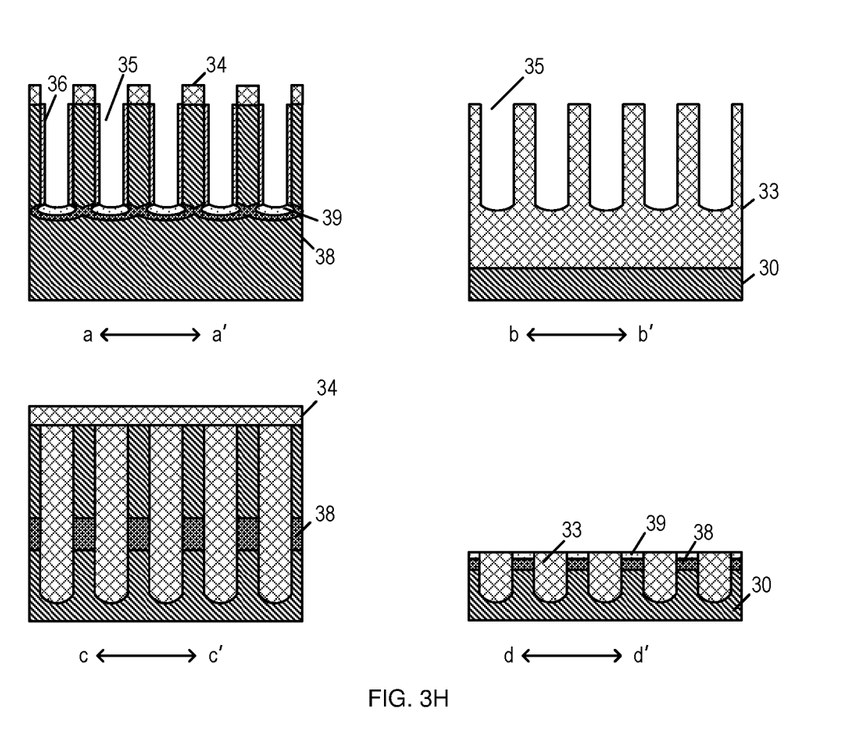

In some embodiments, a remaining part of the substrate 30 between every two adjacent ones of the second recesses 37 spaced apart from each other along the first direction a-a' forms a separation pillar; and a specific step of forming the bit line 20 communicating with the second recesses 37 arranged along the first direction a-a' and filling the second recesses 37 includes:

implanting doping elements into each of the separation pillars and a part of the substrate 30 at the bottom of each of the second recesses 37 to form a bit line contact layer 38 distributed continuously in the second recesses 37 arranged along the first direction a-a', as shown in FIG. 3G; and forming a bit line conductive layer 39 filling each of the second recesses 37 and covering the bit line contact layer 38, as shown in FIG. 3H, to form the bit line 20 including the bit line contact layer 38 and the bit line conductive layer 39.

That a material of the substrate 30 is silicon is used as an example for description below. For example, after the second recess 37 is formed, the doping elements are implanted, along the first etch window, into the part of the separation pillar between adjacent ones of the second recesses 37 and the bottom of the second recess 37 to form the bit line contact layer 38 made of a material of silicide, to improve conductivity of the bit line 20. The doped ions may be, but are not limited to, phosphorus, arsenic, or cobalt. During the implantation of the doping elements, the protective layer 36 still covers the sidewall of the first recess 35. Therefore, the doping elements do not cause damage to the active pillar 22. The separation pillar between adjacent ones of the second recesses 37 is sufficiently doped, such that the adjacent ones of the second recesses 37 can be electrically connected through the bit line contact layer 38. Subsequently, a conductive material such as tungsten may be deposited in the second recess 37 by a selective atomic layer deposition process to form the bit line conductive layer 39 filling the second recess 37, as shown in FIG. 3H.

Step S14. Form, at the bottoms of the first recesses 35, an isolation layer covering the bit line 20, as shown in FIG. 3M.

Figure 3I:
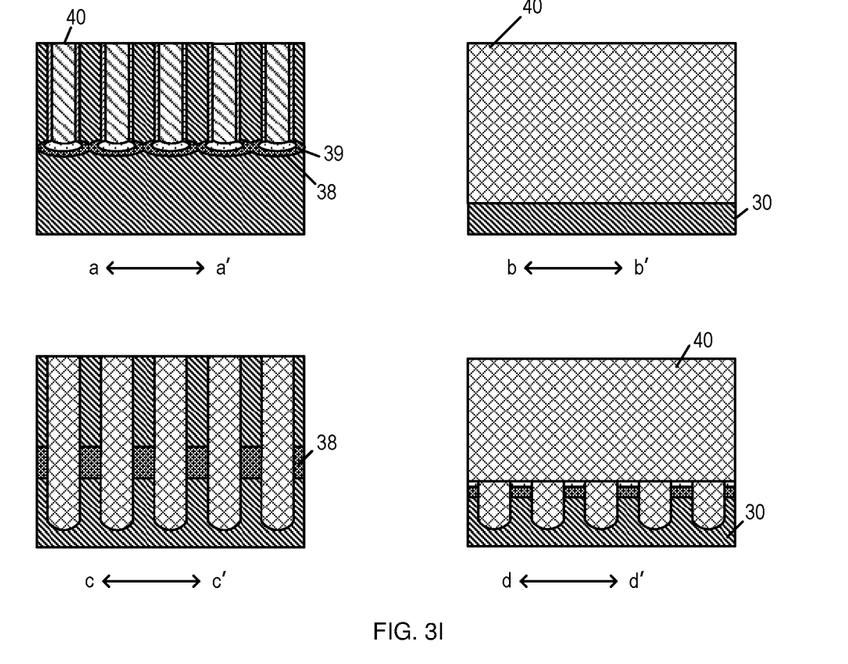
Figure 3J:
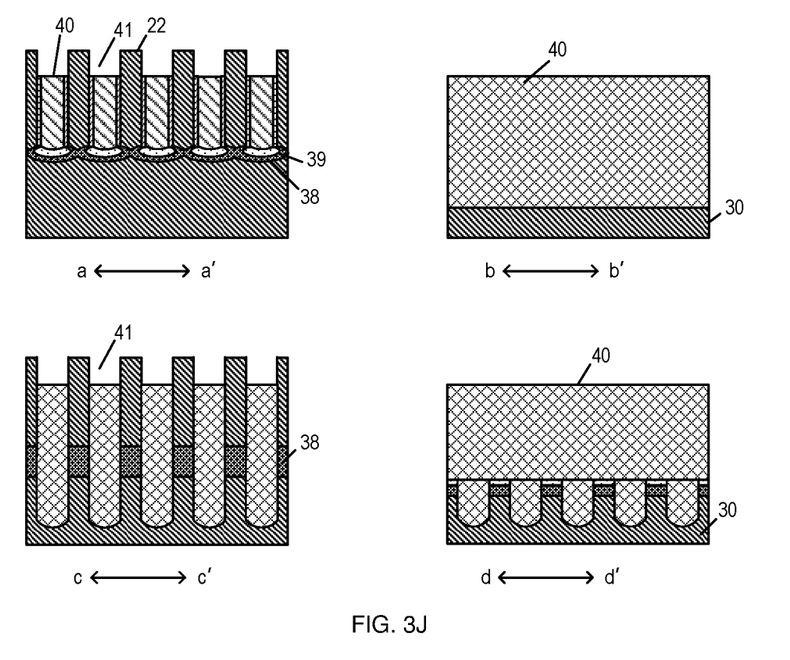
Figure 3K:
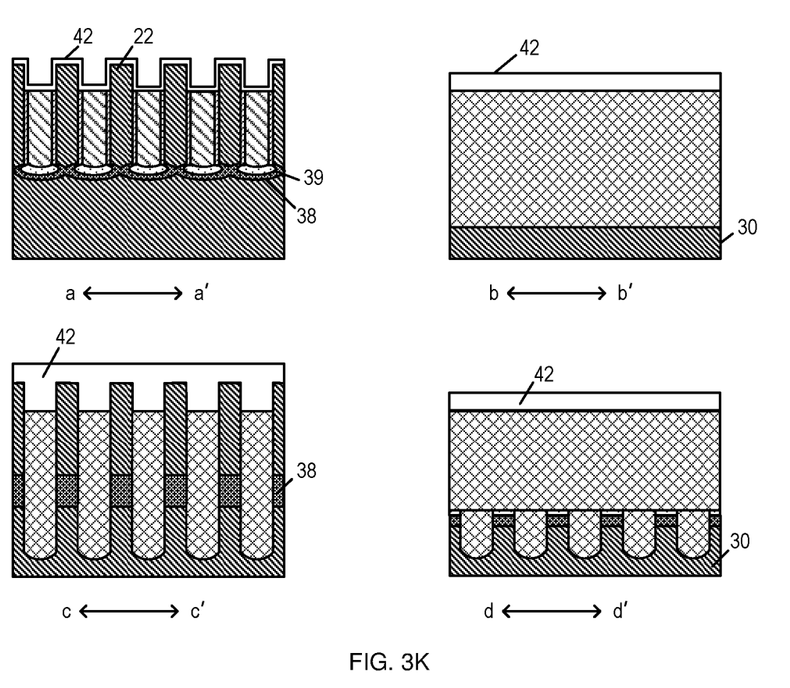
Figure 3L:
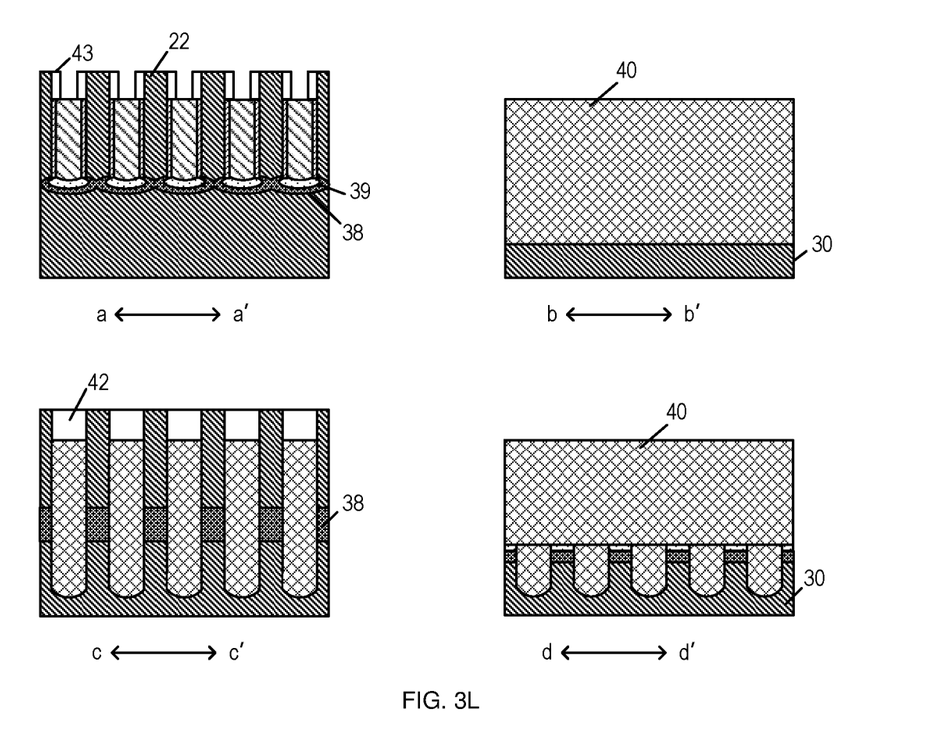
Figure 3M:
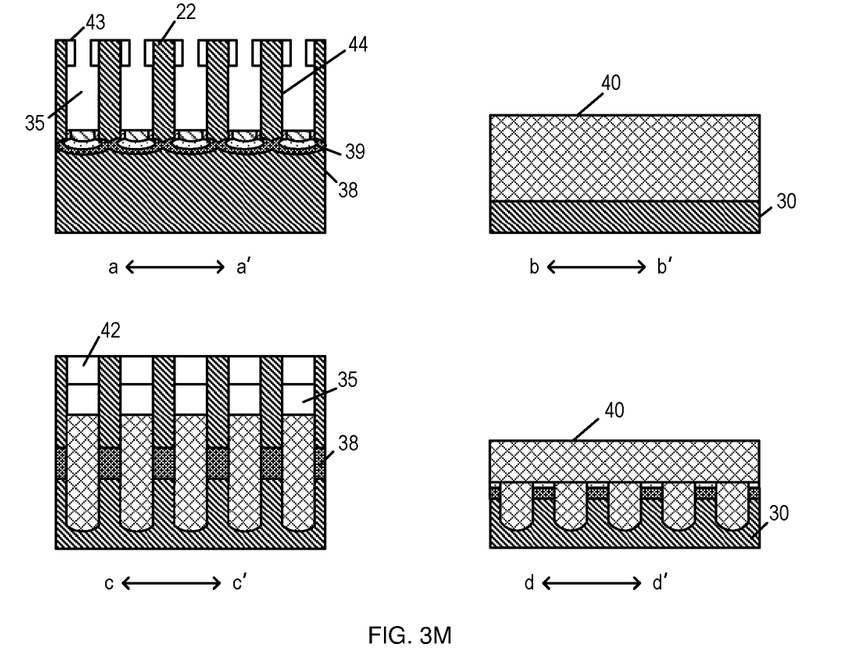

In some embodiments, the active pillar 22 includes a drain region, a channel region located above the drain region, and a source region located above the channel region; and a specific step of forming, at the bottoms of the first recesses 35, an isolation layer covering the bit line 20 includes:

forming a first filling layer 40 filling the first recess 35 and covering a surface of the protective layer 36, as shown in FIG. 3I; and etching back the first filling layer 40 covering a surface of the source region and a surface of the channel region, where a remaining part of the first filling layer 40 on a surface of the drain region forms the isolation layer, as shown in FIG. 3M.

In some embodiments, a specific step of etching back the first filling layer 40 covering a surface of the source region and a surface of the channel region includes:

etching back the first filling layer 40 covering the surface of the source region to expose the source region, as shown in FIG. 3J;

forming a spacer 43 covering a sidewall of the source region, as shown in FIG. 3L; and removing a part of the first filling layer 40 along the spacer 43 to expose the channel region 44, where the remaining part of the first filling layer 40 on the surface of the drain region forms the isolation layer, as shown in FIG. 3M.

Specifically, after the bit line 20 is formed, an insulating material such as an oxide material (for example, silicon dioxide) is deposited into the first recess 35 to form the first filling layer 40, and after removal of the first mask layer 34, the structure shown in FIG. 3I is obtained. Subsequently, a part of the first filling layer 40 and a part of the protective layer 36 are etched back to expose the source region in the active pillar 22 and form a second etched recess 41 located between adjacent ones of the source regions. Subsequently, a hard mask material such as a nitride material (for example, silicon nitride) or an organic mask material such as carbon is deposited on an inner wall of the second etched recess 41 and a top surface of the active pillar 22 to form an initial spacer 42, as shown in FIG. 3K. Next, parts of the initial spacer 42 located on the top surface of the active pillar 22 and on a bottom surface of the second etched recess 41 are removed through etching along a direction perpendicular to the top surface of the substrate 30, and a remaining part of the initial spacer 42 in the second etched recess 41 forms the spacer 43, as shown in FIG. 3L. Then, a part of the first filling layer 40 and a part of the protective layer 36 are further etched back along the spacer 42 to expose the channel region 44, where a remaining part of the first filling layer 40 on the surface of the drain region and a remaining part of the protective layer 36 may jointly form the isolation layer, as shown in FIG. 3M. During etching back of the first filling layer 40 and the protective layer 36, in order to accurately control an etching amount of the first filling layer 40 and the protective layer 36, a one-step etching process or a two-step etching process may be used and an appropriate etching parameter (for example, a parameter such as a temperature or a pressure) is selected, such that a particular thickness of the first filling layer 40 and a particular thickness of the protective layer 36 can remain.

Step S15. Enlarge an inner diameter of the first recess 35 above the isolation layer, as shown in FIG. 3N.

Figure 3N:
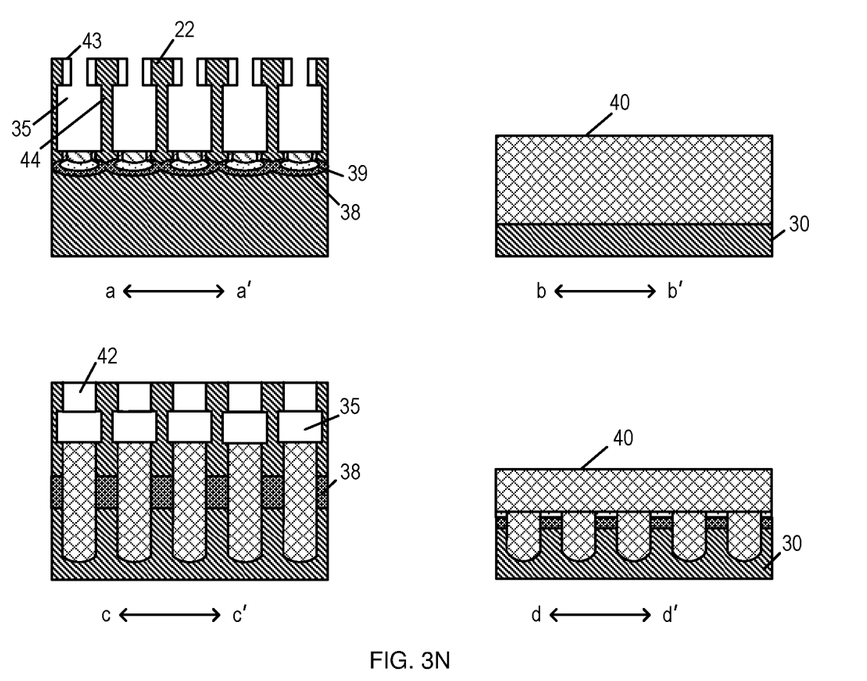

In some embodiments, a specific step of enlarging an inner diameter of the first recess 35 above the isolation layer includes:

performing modification processing on a sidewall of the exposed channel region 44 to form a modified layer; and removing the modified layer to enlarge the inner diameter of the first recess 35 between the spacer 43 and the isolation layer, as shown in FIG. 3N.

Specifically, the spacer 43 covers the sidewall of the source region in the active pillar 22 and the isolation layer covers the sidewall of the drain region. Therefore, the modification processing on the channel region 44 does not cause damage to the source region and the drain region. In this specific implementation, the modification processing is performed on the sidewall of the channel region 44, such that there is a relatively high etch selectivity (for example, an etch selectivity greater than 3) between the sidewall of the channel region 44 and an inner part of the channel region 44 surrounded by the sidewall of the channel region 44. In this way, the sidewall of the channel region 44 and on which the modification processing has been performed can be subsequently removed through selective etching, thereby reducing a width of the channel region 44 and enlarging the inner diameter of the first recess 35 located between adjacent ones of the channel regions 44.

Because a thermal oxidation processing operation process is relatively simple, in some embodiments, the modification processing is thermal oxidation processing, and the modified layer is an oxide layer.

This specific implementation is described by an example in which the modification processing is thermal oxidation processing. In other specific implementations, those skilled in the art may alternatively use other modification processing manners, such as ion doping.

In this specific implementation, the width of the channel region along the first direction a-a' is reduced, such that on one hand, a space of a subsequently formed gate layer (especially a gate-all-around structure) can be increased; on the other hand, the channel region with the relatively small width is easier to control, thereby helping improve overall performance of a transistor. In addition, a thermal oxidation layer undergoes modification processing through thermal oxidation and is removed, such that the active pillar can be rounded, thereby reducing a leakage current of the transistor and improving the performance of the transistor.

Step S16. Form a gate layer 48 on a sidewall of the first recess 35 whose inner diameter is enlarged, as shown in FIG. 3P.

Figure 3O:
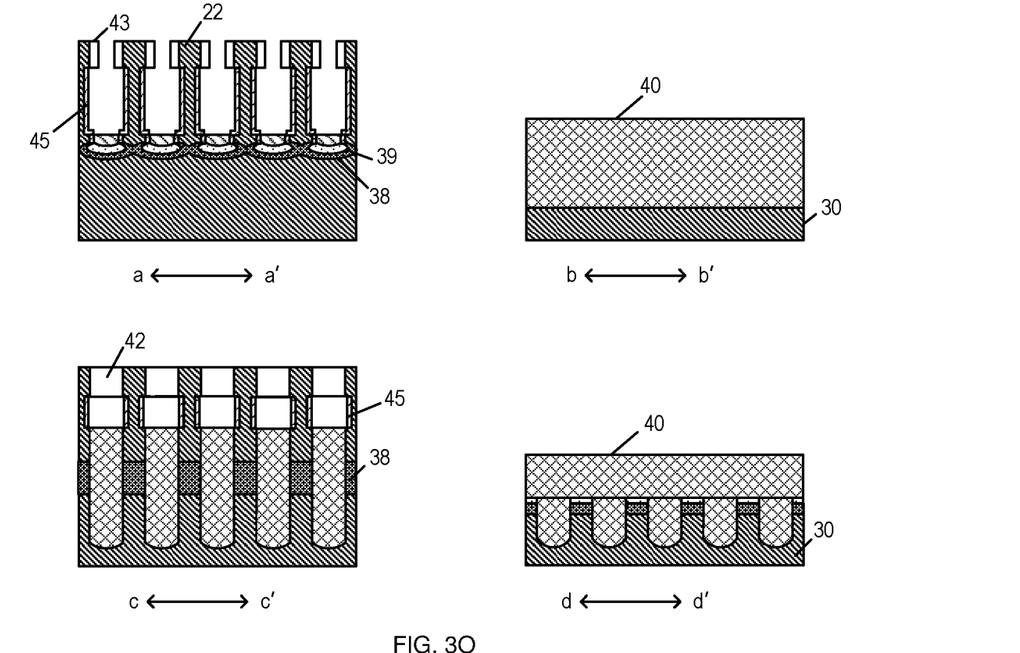
Figure 3P:
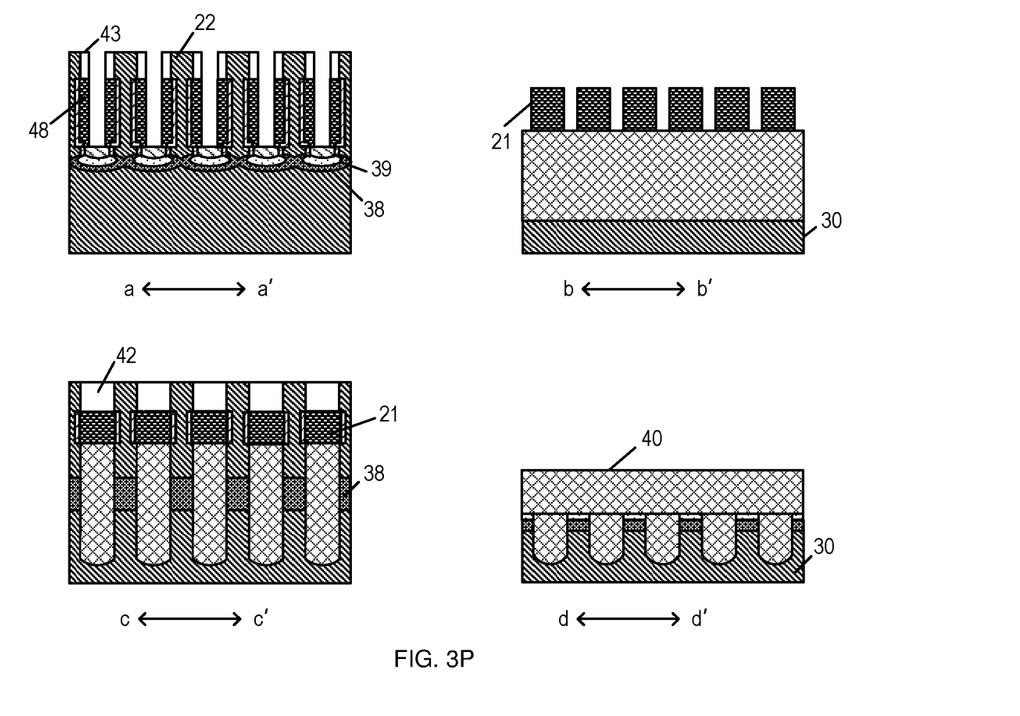
Figure 3Q:
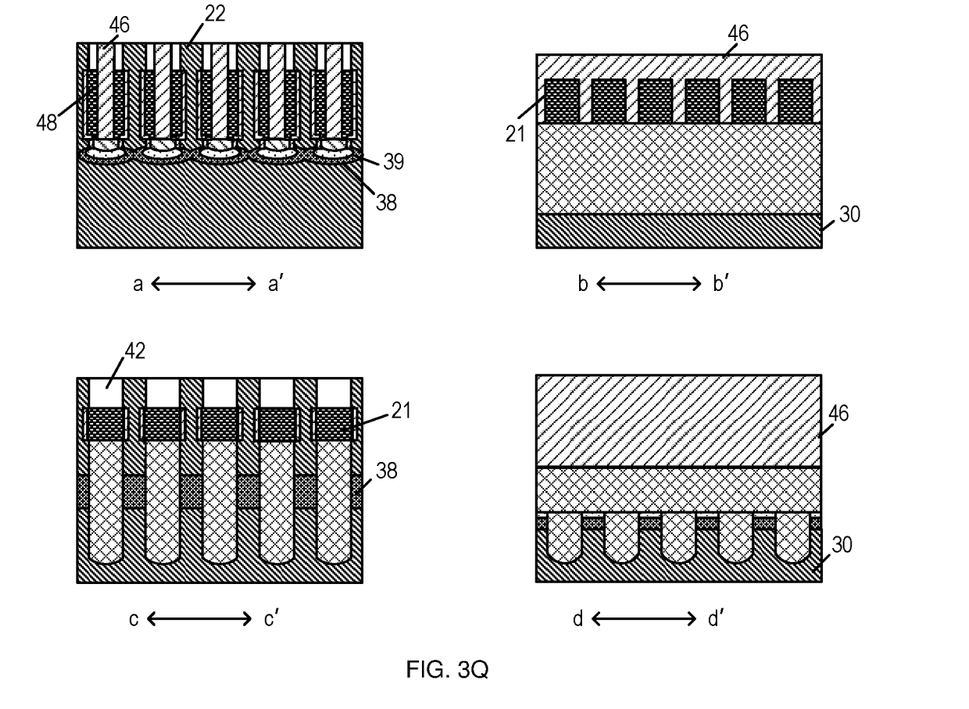

In some embodiments, a specific step of forming a gate layer 48 on a sidewall of the first recess 35 whose inner diameter is enlarged includes:

forming, by an in-situ steam generation process, a gate oxide layer 45 on an inner wall of the first recess 35 whose inner diameter is enlarged, as shown in FIG. 3O;

forming an initial gate layer filling the first recess 35 and covering the gate oxide layer 45; and etching back a part of the initial gate layer along the spacer 43 to form an opening exposing the isolation layer, where a remaining part of the initial gate layer below the spacer 43 forms the gate layer 48, as shown in FIG. 3P.

That a material of the substrate 30 is silicon is used as an example for description below. For example, after the inner diameter of the first recess 35 between the isolation layer and the spacer 43 is enlarged, the gate oxide layer 45 made of an oxide material is formed on the sidewall of the channel region 44 that is exposed through oxidation by an ISSG process, as shown in FIG. 3O. Subsequently, a conductive material such as tungsten is deposited into the first recess 35 along the spacer 43 to form an initial gate layer covering a surface of the gate oxide layer 45 and a surface of the isolation layer. Subsequently, a part of the initial gate layer is etched back along the spacer in a self-aligned downward direction by the spacer 43 as a mask to expose the isolation layer, where a remaining part of the initial gate layer on the surface of the gate oxide layer 45 forms the gate layer 48, as shown in FIG. 3P. A plurality of the gate layers 48 arranged in parallel along the third direction c-c' are connected to form a word line 21 extending along the third direction c-c' (referring to FIG. 2). Subsequently, an oxide material (for example, silicon dioxide) is deposited in a void region between adjacent ones of the gate layers 48 to form a gate isolation layer 46, as shown in FIG. 3Q.

Figure 4:
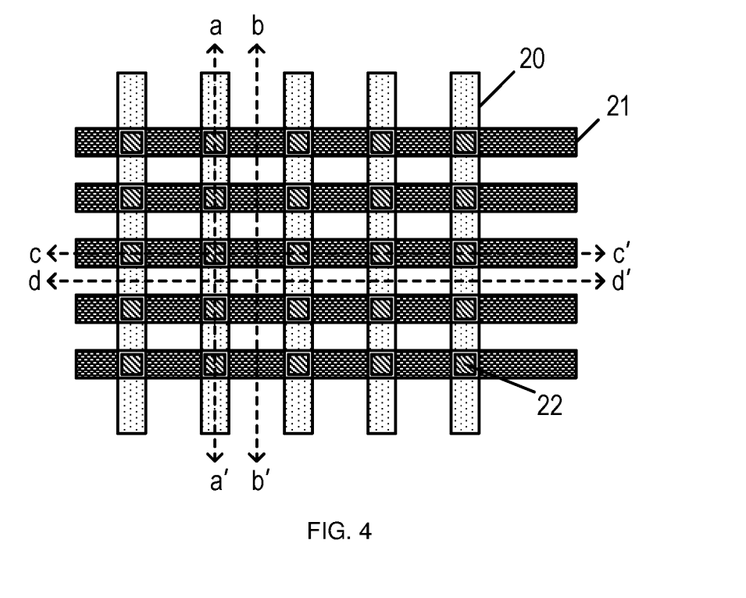
FIG. 4 is a top view of a partial structure of a semiconductor device according to a specific implementation of the present disclosure.
Figure 5:
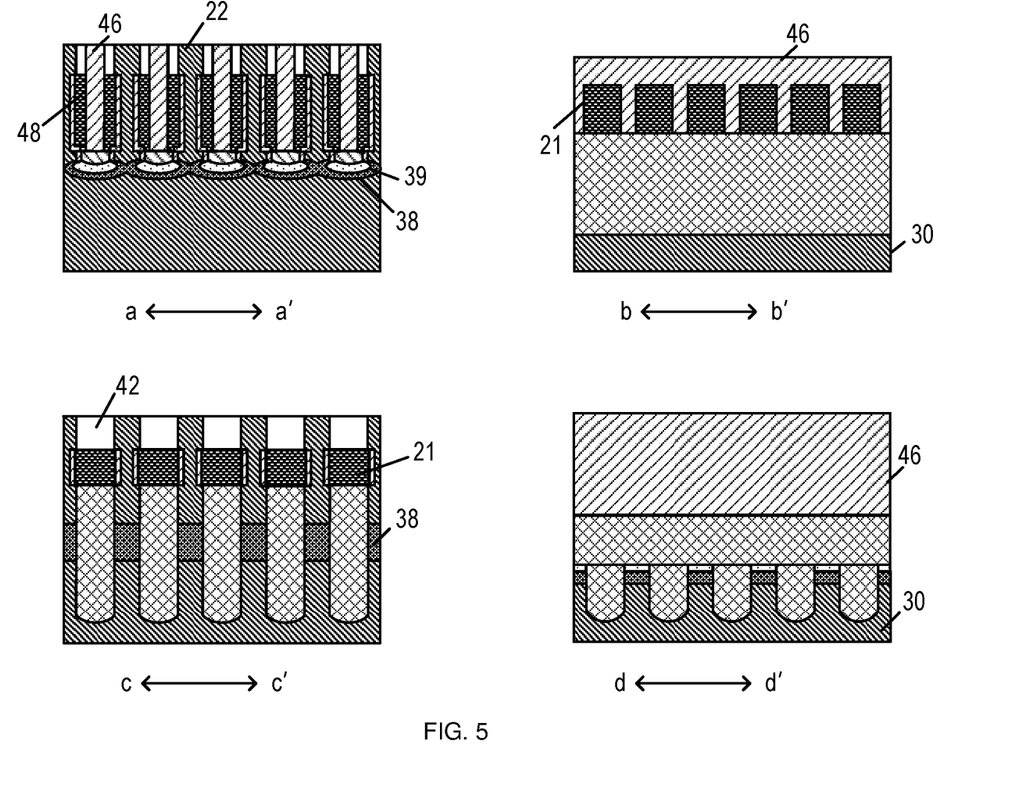
FIG. 5 is a schematic cross-sectional view of a semiconductor device according to a specific implementation of the present disclosure.

The specific implementations further provide a semiconductor device. FIG. 4 is a top view of a partial structure of a semiconductor device according to a specific implementation of the present disclosure. FIG. 5 is a schematic cross-sectional view of a semiconductor device according to a specific implementation of the present disclosure. FIG. 5 includes schematic cross-sectional diagrams along four directions in FIG. 4: a first direction a-a', a second direction b-b', a third direction c-c', and a fourth direction d-d'. The semiconductor device in this specific implementation may be, but is not limited to, a memory, for example, a DRAM. As shown in FIG. 1-FIG. 2, FIG. 3A-FIG. 3Q, FIG. 4, and FIG. 5, the semiconductor device includes:

a substrate 30;

bit lines 20, located in the substrate 30 and extending along a first direction a-a', where the first direction a-a' is a direction parallel to a top surface of the substrate 30;

active pillars 22, located in the substrate 30 and above the bit line 20, where each of the active pillars 22 includes a drain region in contact with the bit line and a channel region 44 located above the drain region, and a width of the drain region is greater than a width of the channel region 44 along the first direction a-a';

an isolation layer, located above the bit line 20 and covering a sidewall of the drain region; and a gate layer 48, distributed around a periphery of the channel region 44 in the active pillar 22.

Specifically, as shown in FIG. 2 and FIG. 4, the bit lines 20 extend along the first direction a-a' and a plurality of the bit lines 20 are arranged parallel to and spaced apart from each other along the third direction c-c'. A plurality of the gate layers 48 arranged spaced apart from each other along the third direction c-c' are connected to form a word line 21 extending along the third direction c-c', and a plurality of the word lines 21 are arranged spaced apart from each other along the first direction a-a'. In this specific implementation, a width of the channel region 44 along the first direction a-a' is set to be less than a width of the drain region along the first direction a-a', such that a space of the gate layer 48 distributed around the periphery of the channel region is increased, thereby simplifying a manufacturing process of the semiconductor device. In addition, a channel region with a relatively small width is easier to control, thereby simplifying subsequent control operations of a transistor.

In some embodiments, the bit line 20 includes:

a bit line contact layer 38; and a bit line conductive layer 39, covering a surface of the bit line contact layer 38.

Specifically, the bit line contact layer 38 is located between the substrate 30 and the bit line conductive layer 39, for improving electric conductivity of the bit line 20.

In some embodiments, the bit line contact layer 38 is made of a silicon material including doping elements, and the doping elements are cobalt, phosphorus, or arsenic.

In some embodiments, the isolation layer includes:

a protective layer 36, covering a sidewall of the drain region; and a first filling layer 40, covering a surface of the bit line conductive layer 39 and a surface of the protective layer 36.

In some embodiments, a material of the protective layer 36 is the same as that of the first filling layer 40, for example, both are oxide materials (for example, silicon dioxide), so as to simplify a formation process of the semiconductor device.

In some other embodiments, the material of the protective layer 36 may alternatively be different from that of the first filling layer 40, so as to enhance electrical isolation between the bit line 20 and the gate layer 48.

In some embodiments, a cross section of a part of the bit line 20 located below the first filling layer 40 is elliptical, sector-shaped, or polygonal.

In some embodiments, the active pillar 22 further includes a source region located above the channel region 44; and a width of the source region is greater than a width of the channel region 44 along the first direction.

In some embodiments, the semiconductor device further includes:

a spacer 43, covering a sidewall of the source region, where a sidewall of the spacer 43 is flush with a sidewall of the gate layer 48.

In some embodiments, a material of the spacer 43 is different from a material of the gate layer 48, and the material of the spacer 43 is different from a material of the isolation layer. For example, the material of the spacer 43 may be a nitride material (for example, silicon nitride), the material of the gate layer 48 is a metallic material (for example, tungsten), and the material of the isolation layer is an oxide material (for example, silicon dioxide).

In some embodiments, the semiconductor device further includes:

a gate isolation layer 46, located above the isolation layer and located between every two adjacent ones of the gate layers 48 arranged along the first direction a-a' and between every two adjacent ones of the spacers 43.

In this specific implementation, a width of the channel region 44 along the first direction a-a' should not be extremely large; otherwise, it is impossible to provide a relatively large space for the formation of the gate layer 48. The width of the channel region 44 should not be extremely small; otherwise, the active pillar 22 is prone to fall or collapse, resulting in adverse impact on the performance of the transistor. In order to provide a sufficient space for the formation of the gate layer 48 while maintaining stability of the active pillar 22 and facilitating the control of the channel region, in one embodiment, the width of the channel region 44 along the first direction a-a' is ⅓ to ½ of the width of the drain region.

According to the semiconductor device and the forming method thereof provided in some embodiments of the specific implementations, first recesses and second recesses located below the first recesses and communicating with the first recesses are first formed, and after a bit line is formed in the second recesses, an inner diameter of the first recess subsequently used for depositing a gate layer is enlarged, such that a space for forming the gate layer is increased, and a formation process of the gate layer is simplified, thereby reducing complexity of forming the semiconductor device. Moreover, the enlargement of the inner diameter of the first recess reduces a width of each of channel regions located on two sides of the first recess, which is more conducive to control of the channel regions, thereby improving overall performance of a transistor, and further improving a yield of the semiconductor device. In addition, in the specific implementations, a spacer is formed on a sidewall of an active pillar, and the spacer is used as a mask, such that an etching process of a word line isolation region can be performed by a self-alignment process, thereby helping simplify a manufacturing process of the semiconductor device.

The above described are merely preferred implementations of the present disclosure. It should be noted that several improvements and modifications may further be made by a person of ordinary skill in the art without departing from the principle of the present disclosure, and such improvements and modifications should also be deemed as falling within the protection scope of the present disclosure.

The invention claimed is:

1. A forming method of a semiconductor device, comprising:
   providing a substrate;
   etching the substrate to form first recesses and second recesses located below the first recesses and communicating with the first recesses;
   forming a bit line in the second recesses;
   forming, at bottoms of the first recesses, an isolation layer covering the bit line;
   enlarging an inner diameter of each of the first recesses above the isolation layer; and
   forming a gate layer on a sidewall of each of the first recesses whose inner diameter is enlarged;
   wherein forming first recesses and second recesses located below the first recesses and communicating with the first recesses comprises:
   etching the substrate to form a plurality of first recesses arranged parallel to and spaced apart from each other along a first direction and an active pillar located between adjacent ones of the first recesses, wherein the first recesses extend along a direction perpendicular to a top surface of the substrate, and the first direction is a direction parallel to the top surface of the substrate; and
   etching the substrate along the first recesses, and forming, below the first recesses, the second recesses communicating with the first recesses, wherein an inner diameter of each of the second recesses is greater than the inner diameter of the first recess located above and communicating with the each of the second recesses;
   wherein a remaining part of the substrate between every two adjacent ones of the second recesses spaced apart from each other along the first direction forms a separation pillar;
   and the forming a bit line in the second recesses comprises:
   implanting doping elements into each of the separation pillars and a part of the substrate at a bottom of each of the second recesses to form a bit line contact layer distributed continuously in the second recesses arranged along the first direction; and
   forming a bit line conductive layer filling each of the second recesses and covering the bit line contact layer to form the bit line comprising the bit line contact layer and the bit line conductive layer.

2. The forming method of a semiconductor device according to claim 1, wherein a cross section of each of the second recesses is elliptical, fan-shaped, or polygonal.

3. The forming method of a semiconductor device according to claim 1, wherein before forming the second recesses located below the first recesses and communicating with the first recesses, the forming method further comprises:
   forming a protective layer covering the sidewall of each of the first recesses.

4. The forming method of a semiconductor device according to claim 3, wherein the active pillar comprises a drain region, a channel region located above the drain region, and a source region located above the channel region; and the forming, at bottoms of the first recesses, an isolation layer covering the bit line comprises:
   forming a first filling layer filling each of the first recesses and covering a surface of the protective layer; and
   etching back the first filling layer covering a surface of the source region and a surface of the channel region, wherein a remaining part of the first filling layer on a surface of the drain region forms the isolation layer.

5. The forming method of a semiconductor device according to claim 4, wherein the etching back the first filling layer covering a surface of the source region and a surface of the channel region comprises:
   etching back the first filling layer covering the surface of the source region to expose the source region;
   forming a spacer covering a sidewall of the source region; and
   removing a part of the first filling layer along the spacer to expose the channel region, wherein the remaining part of the first filling layer on the surface of the drain region forms the isolation layer.

6. The forming method of a semiconductor device according to claim 5, wherein the enlarging an inner diameter of each of the first recesses above the isolation layer comprises:
   performing modification processing on a sidewall of the exposed channel region to form a modified layer; and
   removing the modified layer to enlarge the inner diameter of each of the first recesses between the spacer and the isolation layer.

7. The forming method of a semiconductor device according to claim 6, wherein the modification processing is thermal oxidation processing, and the modified layer is an oxide layer.

8. The forming method of a semiconductor device according to claim 5, wherein the forming a gate layer on a sidewall of each of the first recesses whose inner diameter is enlarged comprises:
   forming, by an in-situ steam generation (ISSG) process, a gate oxide layer on an inner wall of each of the first recesses whose inner diameter is enlarged;

forming an initial gate layer filling each of the first recesses and covering the gate oxide layer; and etching back a part of the initial gate layer along the spacer to form an opening exposing the isolation layer, wherein a remaining part of the initial gate layer below the spacer forms the gate layer.

\* \* \* \* \*